United States Patent
Zhang et al.

(10) Patent No.: US 8,289,663 B2
(45) Date of Patent: Oct. 16, 2012

(54) ULTRA LOW RA (RESISTANCE X AREA) SENSORS HAVING A MULTILAYER NON-MAGNETIC SPACER BETWEEN PINNED AND FREE LAYERS

(75) Inventors: Kunliang Zhang, Fremont, CA (US); Tong Zhao, Fremont, CA (US); Hui-Chuan Wang, Pleasanton, CA (US); Min Li, Dublin, CA (US)

(73) Assignee: Headway Technologies, Inc., Milpitas, CA (US)

( * ) Notice: Subject to any disclaimer, the term of this patent is extended or adjusted under 35 U.S.C. 154(b) by 446 days.

(21) Appl. No.: 12/150,191

(22) Filed: Apr. 25, 2008

(65) Prior Publication Data

US 2009/0269617 A1    Oct. 29, 2009

(51) Int. Cl.
*G11B 5/39* (2006.01)
(52) U.S. Cl. .................................... 360/324.2
(58) Field of Classification Search ............... 360/324.2; 257/421–427; 365/145, 158, 171–173; 324/244–263; 428/810–816
See application file for complete search history.

(56) References Cited

U.S. PATENT DOCUMENTS

| | | | |
|---|---|---|---|
| 5,668,688 A | 9/1997 | Dykes et al. | |
| 5,715,121 A | 2/1998 | Sakakima et al. | |
| 7,301,733 B1 | 11/2007 | Fukuzawa et al. | |
| 7,333,306 B2 | 2/2008 | Zhao et al. | |
| 7,423,847 B2 * | 9/2008 | Carey et al. | 360/324.1 |
| 7,672,085 B2 * | 3/2010 | Hara et al. | 360/324 |
| 7,782,575 B2 * | 8/2010 | Tsuchiya et al. | 360/324.1 |
| 2006/0034022 A1 | 2/2006 | Fukuzawa et al. | |
| 2007/0070556 A1 | 3/2007 | Zhang et al. | |
| 2007/0091514 A1 | 4/2007 | Freitag et al. | |
| 2007/0164265 A1 | 7/2007 | Kajiyama | |
| 2007/0176519 A1 | 8/2007 | Sbiaa et al. | |
| 2007/0188945 A1 | 8/2007 | Fuji et al. | |
| 2007/0242395 A1 | 10/2007 | Bailey | |
| 2008/0032159 A1 | 2/2008 | Gill | |

OTHER PUBLICATIONS

"Effect of interface states on spin-dependent tunneling in Fe/MgO/Fe tunnel junctions," by K. D. Belashchenko, et al., 2005 The American Physical Society, Physical Review B 72, 140404(R) (2005), pp. 1-4.
"Spin-Polarized Resonant Tunneling in Magnetic Tunnel Junctions," by S. Yuasa, et al., Science AAAS, Science 297, 234 (2002); DOI: 10.1126/science.1071300, found: www.sciencemag.org on Oct. 9, 2007, pp. 234-237.

(Continued)

*Primary Examiner* — Allen Heinz
(74) *Attorney, Agent, or Firm* — Saile Ackerman LLC; Stephen B. Ackerman

(57) ABSTRACT

A high performance TMR sensor with a spacer including at least one metal layer such as Cu and one or more MgO layers is disclosed. In addition, there may be a metal dopant in the MgO layer. In an alternative embodiment, the MgO layer may be replaced by other low band gap insulating or semiconductor materials. An ultra-low RA of <0.4 $\mu ohm\text{-}cm^2$ in combination with a MR of 14%, low magnetostriction, and a low Hin value of about 20 Oe is achieved with a composite spacer of the present invention. The Cu layer thickness is from 0.1 to 10 Angstroms and the MgO thickness is from 5 to 20 Angstroms in spacer configurations including Cu/MgO/Cu, and MgO/Cu/MgO.

26 Claims, 3 Drawing Sheets

OTHER PUBLICATIONS

"Theory of resonant tunneling in an epitaxial Fe/Au/Mgp/Au/Fe(001) junction," by J. Mathon, et al., 2005 The American Physical Society, Physical Review B 71, 220402(R) (2005), pp. 1-4.

"Resonant spin-dependent tunneling in spin-valve junctions in the presence of paramagnetic impurities," by A. Vedyayev, et al., 2001 The American Physical Society, Physical Review B, vol. 63, 064429, pp. 1-13.

"Enhanced GMR effect of FeCo alloy CPP spin valve films," by M. Yoshikawa et al., Toshiba, R&D Center, Kawasaki, Japan, TMRC2004, Aug. 20, 2001, 9 pages.

"Evidence of a Symmetry-Dependent Metallic Barrier in Fully Epitaxial MgO Based Magnetic Tunnel Junctions," by F. Gruellet, et al., 2007 The American Physical Society, PRL 99, 187202 (2007), Physical Review Letters, week ending Nov. 2, 2007, pp. 1-4.

"Large inverse magnetoresistance in fully epitaxial Fe/Fe3O4/MgO/Co magnetic tunnel junctions," by F. Greullet et al., Applied Physics Letters 92, 053508 (2008), 2008 American Institute of Physics, published Feb. 8, 2008, pp. 1-3.

"The scalability of CPP-GMR heads toward over 100Gbpsi, compared with TMR heads," by M. Takagishi et al., Aug. 20, 2001, 11 pgs, R&D Center,Toshiba Corporation, Kawasaki, Japan.

* cited by examiner

ULTRA LOW RA (RESISTANCE X AREA) SENSORS HAVING A MULTILAYER NON-MAGNETIC SPACER BETWEEN PINNED AND FREE LAYERS

RELATED PATENT APPLICATION

This application is related to the following: Ser. No. 11/234,719, filing date Sep. 23, 2005 and now U.S. Pat. No. 7,583,481; assigned to a common assignee, and which is herein incorporated by reference in its entirety.

FIELD OF THE INVENTION

The invention relates to a high performance tunneling magnetoresistive (TMR) sensor in a read head and a method for making the same, and in particular, to a spacer between two ferromagnetic layers that is a composite of Cu and MgO or another low band gap insulating or semiconductor material which affords a high magnetoresistive (MR) value and a low resistance x area (RA) value.

BACKGROUND OF THE INVENTION

A TMR sensor otherwise known as a magnetic tunneling junction (MTJ) is a key component (memory element) in magnetic devices such as Magnetic Random Access Memory (MRAM) and a magnetic read head. A TMR sensor typically has a stack of layers with a configuration in which two ferromagnetic layers are separated by a thin non-magnetic insulator layer. The sensor stack in a so-called bottom spin valve configuration which is preferred for biasing reasons is generally comprised of a seed (buffer) layer, anti-ferromagnetic (AFM) layer, pinned layer, tunnel barrier layer, free layer, and capping layer that are sequentially formed on a substrate. The free layer serves as a sensing layer that responds to external fields (media field) while the pinned layer is relatively fixed and functions as a reference layer. The electrical resistance through the tunnel barrier layer (insulator layer) varies with the relative orientation of the free layer moment compared with the reference layer moment and thereby converts magnetic signals into electrical signals. In a magnetic read head, the TMR sensor is formed between a bottom shield and a top shield which also serve as electrodes as described in U.S. Pat. No. 5,715,121. When a sense current is passed from the top shield to the bottom shield in a direction perpendicular to the planes of the TMR layers (CPP designation), a lower resistance is detected when the magnetization directions of the free and reference layers are in a parallel state ("1" memory state) and a higher resistance is noted when they are in an anti-parallel state or "0" memory state. A CPP transducer is disclosed in U.S. Pat. No. 5,668,688. Alternatively, a TMR sensor may be configured as a current in plane (CIP) structure which indicates the direction of the sense current.

A giant magnetoresistive (GMR) head is another type of memory device. In this design, the insulator layer between the pinned layer and free layer in the TMR stack is replaced by a non-magnetic conductive spacer such as copper.

In the TMR stack, the pinned layer may have a synthetic anti-ferromagnetic (SyAF) configuration in which an outer pinned layer is magnetically coupled through a coupling layer to an inner pinned layer that contacts the tunnel barrier. The outer pinned layer has a magnetic moment that is fixed in a certain direction by exchange coupling with the adjacent AFM layer which is magnetized in the same direction. The tunnel barrier layer is so thin that a current through it can be established by quantum mechanical tunneling of conduction electrons.

A TMR sensor is currently the most promising candidate for replacing a GMR sensor in upcoming generations of magnetic recording heads. An advanced TMR sensor may have a cross-sectional area of about 0.1 microns×0.1 microns at the air bearing surface (ABS) plane of the read head. The advantage of a TMR sensor is that a substantially higher MR ratio can be realized than for a GMR sensor. In addition to a high MR ratio, a high performance TMR sensor requires a low areal resistance RA (area×resistance) value, a free layer with low magnetostriction ($\lambda$) on the order of $1 \times 10^{-8}$ to $<5 \times 10^{-6}$ and low coercivity (Hc) below 10 Oe such as CoFe/NiFe, a strong pinned layer, and low interlayer coupling (Hin) through the barrier layer. The MR ratio (also referred to as TMR ratio) is dR/R where R is the minimum resistance of the TMR sensor and dR is the change in resistance observed by changing the magnetic state of the free layer. A higher dR/R improves the readout speed. For high recording density or high frequency applications, RA must be reduced to about 1 to 3 ohm-$\mu m^2$.

MgO based TMR technology has been used primarily for high density magnetic recording due to its intrinsic high TMR ratio originating from so-called coherent tunneling which is directly related to wave function symmetry of the neighboring CoFe and MgO band structure. Currently, very large TMR values exceeding 100% can be obtained rather easily at RT with an RA of less than 10 ohm-$\mu m^2$ which makes this technology easily adaptable to device applications, especially for read head sensors.

As recording density becomes higher and higher, it is critical to make the MgO tunnel barrier as thin as possible in order to match the resistance of the MTJ to other electronic components. Unfortunately, the TMR ratio drops drastically as the MgO barrier thickness becomes too thin. Also, the interlayer coupling (Hin) between the AP1 pinned layer and the free layer soars to a very high value as MgO thickness is thinned, making it vary difficult to adjust the bias point and causing performance degradation. Therefore, alternative sensors are needed that are more easily implemented in an ultra-low RA regime.

In the prior art, K. Belashchenko et al. in Phys. Review B 72, 140404 R (2005) have correlated the sharp TMR reduction at small MgO barrier thickness to the emergence of an interfacial resonant state controlled by the minority spin band. They predicted that a Ag monolayer epitaxially deposited at the interface between a CoFe pinned layer and MgO tunnel barrier would suppress the tunneling through the minority band and enhance the TMR ratio for thin MgO layers. Unfortunately, Ag is highly diffusive and is typically extremely difficult to grow well on CoFe surfaces. Thus, Ag insertion has not been successful in significantly improving TMR. Other approaches are necessary to reach a high TMR value with ultra-low RA.

F. Greullet et al. in "Large inverse magnetoresistance in fully epitaxial Fe/Fe$_3$O$_4$/MgO/Co magnetic tunnel junctions", Appl. Phys. Lett. 92, 053508 (2008) report that a large negative TMR value can be changed to a positive value by varying the applied bias. In a related paper by F. Greullet et al. entitled "Evidence of a Symmetry-Dependent Metallic Barrier in Fully Epitaxial MgO Based Magnetic Tunnel Junctions", Phys. Rev. Lett. Nov. 2; 99 (18) 187202 (2007), tunneling across an ultrathin Cr spacer inserted at the interface of a Fe/MgO/Fe(001) junction is described.

S. Yuasa et al. have reported the effect of inserting a thin non-magnetic copper layer between an aluminum oxide tunnel barrier and Co(001) ferromagnetic layer in "Spin-Polarized Resonant Tunneling in Magnetic Tunnel Junctions", Science, Vol. 297, 234-237 (2002).

An ultra thin Cr spacer is inserted in a Fe/MgO/Fe(001) junction to promote quantum well states in an adjacent Fe layer as described by F. Greullet et al. in "Evidence of a Symmetry-Dependent Metallic Barrier in Fully Epitaxial MgO Based Magnetic Tunnel Junctions", Phys. Rev. Lett. Vol. 18, 187202 (2007).

Resonant tunneling is also suggested for a configuration where a barrier is sandwiched between two quantum wells as described by J. Mathon and A. Umerski in "Theory of resonant tunneling in an epitaxial Fe/Au/MgO/Au/Fe(001) junction", Phys. Rev. B, Vol. 71, 220402(R) (2005).

A. Vedyayev et al. in "Resonant spin-dependent tunneling in spin-valve junctions in the presence of paramagnetic impurities", Phys. Rev. B, Vol. 63, 064429 (2001) describe the effect of impurities in the insulator in a $Co/Al_2O_3/Co$ junction.

U.S. Pat. No. 7,333,306, U.S. Patent Appl. 2006/0034022, and U.S. Patent Appl. 2007/0188945 all refer to a spacer comprised of a confining current path (CCP) configuration in which a MgO layer with Cu paths formed therein is sandwiched between two Cu layers in a MTJ stack.

U.S. Patent Appl. 2007/0091514, U.S. Patent Appl. 2007/0242395, U.S. Patent Appl. 2008/0032159, and U.S. Patent Appl. 2007/0176519 all relate to a spin valve spacer made of Cu or MgO.

In U.S. Pat. No. 7,301,733, a nano oxide layer is inserted in a free layer or in a pinned layer but is kept a certain distance from a spacer layer in a spin valve stack.

U.S. Patent Appl. 2007/0164265 describes a dual spin valve containing both a Cu spacer and a MgO tunnel barrier but the two layers are separated by a free layer

SUMMARY OF THE INVENTION

One objective of the present invention is to provide a TMR sensor with an AP1/spacer/free layer configuration that enables ultra-low RA values of less than about 1 micro ohm-$cm^2$ (1 ohm-$\mu m^2$) with an acceptable MR ratio for high density magnetic recording.

A second objective of the present invention is to provide a TMR sensor according to the first objective that also has acceptable interlayer coupling (Hin).

According to one embodiment of the present invention, these objectives are achieved by forming a TMR sensor on a suitable substrate such as a bottom shield in a read head. The TMR sensor may have a bottom spin valve configuration comprised of a seed layer, AFM layer, pinned layer, spacer, free layer, and capping layer which are formed sequentially on the bottom shield. The pinned layer preferably has a synthetic anti-ferromagnetic (SyAF) configuration with an AP2 layer contacting the AFM layer, an AP1 layer adjoining the spacer, and a coupling layer between the AP1 and AP2 layers. In one aspect, the AP2 layer is a FCC like trilayer with a composition represented by $Co_ZFe_{(100-Z)}/Fe_YCo_{(100-Y)}/Co_ZFe_{(100-Z)}$ where y is 40 to 100 atomic % and z is 75 to 100 atomic %. The coupling layer is one of Ru, Rh, or Ir and the AP1 layer is preferably a laminated film comprised of CoFe and Cu layers with a $[CoFe/Cu]_m$/CoFe configuration where m is 1 to 3.

A key feature is the spacer layer that in one embodiment has a Cu/MgO/Cu, MgO/Cu/MgO, Cu/MgO/Cu/MgO/Cu, Cu/MgO, MgO/Cu, or a $(Cu/MgO)_n$/Cu configuration where n is an integer. In another embodiment, the MgO layer may be replaced by other low band gap insulating materials or semiconductor materials including ZnO, $Zn_xMg_{(1-x)}O$ where x is from 0 to 99 atomic %, ZnCuO, ZnCdO, ZnAlO, ZnSe, ZnTe, ZnS, $SrTiO_3$, SrOx, LaMnOx, Si, Ge, TiOx, AlN, GaN, InN, AlP, AlAs, AlSb, GaP, GaAs, GaSb, InP, InAs, CdS, CdTe, HgTe, PbS, PbSe, PbTe, SnTe, $Cu_2O$, $FeSi_2$, CrMnSi, $Mg_2Si$, $RuSi_3$, $Ir_3Si_5$ or semi-metals such as Sb, Bi, CoSi, FeSi, $Co_XFe_{(1-X)}Si$, $Co_XMn_{(1-X)}Si$, or $Co_XCr_{(1-X)}Si$. In yet another embodiment, the one or more MgO layers in the spacer may be doped with one or more of Zn, Mn, Al, Cu, Ni, Cd, Cr, Ti, Zr, Hf, Ru, Mo, Nb, Fe, Co and the like in an amount of up to about 50 atomic %. In an alternative embodiment, the Cu layer in the spacer may be replaced by Au, Ag, Zn, Ru, or Al, for example.

All of the layers in the TMR stack may be laid down in a DC sputtering chamber of a sputtering system such as an Anelva C-7100 sputter deposition system which includes ultra high vacuum DC magnetron sputter chambers with multiple targets and at least one oxidation chamber. The one or more MgO layers in the spacer may be formed by a natural oxidation (NOX) or radical oxidation (ROX) process in an oxidation chamber within the sputtering system. After all of the TMR layers are deposited, the TMR stack is patterned by a conventional method to yield a TMR sensor prior to forming an insulation layer adjacent to the TMR sensor and a top shield on the cap layer.

DETAILED DESCRIPTION OF THE INVENTION

The present invention is a high performance TMR sensor having a composite spacer comprised of at least one metal layer and one or more low band gap insulating or semiconductor materials, and a method for making the same. While the exemplary embodiment depicts a TMR sensor in a read head, the present invention may be employed in other devices based on a tunneling magnetoresistive element such as MRAM structures, or in a GMR-CPP sensor. The TMR sensor may have a bottom spin valve, top spin valve, or multi-layer spin value configuration as appreciated by those skilled in the art. Drawings are provided by way of example and are not intended to limit the scope of the invention.

Figure 1A:
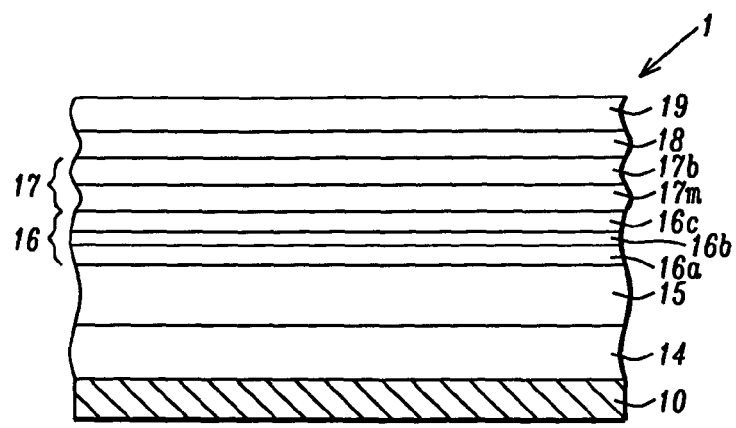
FIG. 1a and FIG. 1b are cross-sectional views showing a TMR stack of layers including a spacer comprised of one metal layer and one insulator layer according to embodiments of the present invention.

Referring to FIG. 1a, a portion of a partially formed TMR sensor 1 of the present invention is shown from the plane of an air bearing surface (ABS). There is a substrate 10 that in one embodiment is a bottom lead otherwise known as a bottom shield (S1) which may be a NiFe layer about 2 microns thick that is formed by a conventional method on a substructure (not shown). It should be understood that the substructure may be comprised of a wafer made of AlTiC, for example. A gap layer (not shown) may be inserted between the bottom shield and seed layer 14.

A TMR stack is formed on the substrate 10 and in the exemplary embodiment has a bottom spin valve configuration wherein a seed layer 14, AFM layer 15, pinned layer 16, composite spacer 17 having a lower metal layer 17m and an upper insulator layer 17b, free layer 18, and capping layer 19 are sequentially formed on the substrate. The seed layer 14 is preferably a Ta/Ru composite but Ta, Ta/NiCr, Ta/Cu, Ta/Cr or other seed layer configurations may be employed, instead. The seed layer 14 serves to promote a smooth and uniform grain structure in overlying layers. Above the seed layer 14 is an AFM layer 15 used to pin the magnetization direction of the overlying pinned layer 16, and in particular, the outer portion or AP2 layer (not shown). The AFM layer 15 may have a thickness from 40 to 300 Angstroms and is preferably comprised of IrMn. Optionally, one of PtMn, NiMn, OsMn, RuMn, RhMn, PdMn, RuRhMn, or MnPtPd may be employed as the AFM layer.

The pinned layer 16 preferably has a synthetic anti-parallel (SyAP) configuration represented by AP2/Ru/AP1 where a coupling layer 16b made of Ru, Rh, or Ir, for example, is sandwiched between an AP2 layer 16a and an AP1 layer 16c. The AP2 layer 16a which is also referred to as the outer pinned layer is formed on the AFM layer 15 and may be made of CoFe with a composition of about 10 atomic % Fe and with a thickness of about 10 to 50 Angstroms. The magnetic moment of the AP2 layer is pinned in a direction anti-parallel to the magnetic moment of the AP1 layer. For example, the AP2 layer 16a may have a magnetic moment oriented along the "+x" direction while the AP1 layer 16c has a magnetic moment in the "−x" direction. A slight difference in thickness between the AP2 and AP1 layers produces a small net magnetic moment for the pinned layer 16 along the easy axis direction of the TMR sensor to be patterned in a later step.

In a preferred embodiment, the AP2 layer is a FCC like trilayer that was previously disclosed in related patent application Ser. No. 11/234,719 and has a composition represented by $Co_ZFe_{(100-Z)}/Fe_{(100-X)}Ta_X/Co_ZFe_{(100-Z)}$ or $Co_ZFe_{(100-Z)}/Fe_YCo_{(100-Y)}/Co_ZFe_{(100-Z)}$ where x is 3 to 30 atomic %, y is 40 to 100 atomic %, and z is 75 to 100 atomic %. Optionally, the FeTa (or FeCo) middle layer in the AP2 trilayer may be replaced by an Fe rich alloy such as FeCr, FeV, FeW, FeZr, FeNb, FeHf, FeMo, or the like. An Fe rich alloy is defined as an alloy having an Fe content of about 70 atomic % or greater. In the $Co_ZFe_{(100-Z)}$ upper and lower layers of the AP2 trilayer structure, z is preferably 90 since it is well known that $Co_{90}Fe_{10}$ easily forms a FCC structure. We have found that when a $Co_{90}Fe_{10}$ layer is grown on a seed/AFM stack comprised of Ta/Ru/IrMn that its [111] planes are exposed to the interfaces with the AFM layer 15 and coupling layer. Since the [111] planes are the closest packed planes for FCC structures, [111] planes should result in lower electron migration (EM) than other types of planes. However, the main purpose for including a FCC trilayer according to the present invention is to improve the pinning strength between the AP2 trilayer and the AFM layer 15.

The terminology "FCC-like triple layer" used in the present invention means that the major component of the AP2 layer is an FCC material, preferably $Co_{90}Fe_{10}$, which is employed as the lower layer and upper layer in the AP2 trilayer structure with an iron rich alloy inserted as a middle layer. Note that the middle layer may not be a face centered cubic material. In the AP2 trilayer, the lower layer with a thickness from about 6 to 15 Angstroms is preferably thinner than the upper layer which is 10 to 50 Angstroms thick. In conventional AP2/coupling/AP1 configurations, the AP2 layer is thinner than the AP1 layer. In this case, AP2 trilayer thickness is greater than the AP1 layer thickness to provide an asymmetry mean adjustment for the transfer curve of the real device. Furthermore, the lower layer in the AP2 trilayer is thinner than the upper layer to enhance the exchange coupling strength with the AFM layer 15. The Fe rich middle layer in the AP2 trilayer serves to enhance the exchange coupling strength of the FCC-like trilayer with the AFM layer 15. It is believed that the AP2 trilayer has an advantage over prior art AP2 single layers made of $Co_{75}Fe_{25}$ or $Co_{50}Fe_{50}$ because the AP2 trilayer has a similar exchange coupling strength as a single $Co_{75}Fe_{25}$ or $Co_{50}Fe_{50}$ AP2 layer but its FCC-like structure provides a substantial EM improvement.

Exchange coupling between the AP2 layer and the AP1 layer in the pinned layer 16 is facilitated by a coupling layer (not shown) that is preferably comprised of Ru with a thickness from 3 to 9 Angstroms. The AP1 layer is also referred to as the inner pinned layer and may be a composite layer or a single layer such as CoFe or a CoFeX alloy where X=Ni, Cu, Cr, Mo, Zr, or the like. In one aspect, the AP1 layer may be an amorphous layer such as CoFeB, CoB, or FeB in order to provide a more uniform surface on which to form the spacer 17. In another embodiment, the AP1 layer may be a composite with a $[CoFe/Cu]_m/CoFe$ configuration wherein m=1, 2, or 3. The use of a laminated AP1 layer to improve CPP-GMR properties is well known to those skilled in the art. All of the CoFe and Cu layers in the AP1 layer have a magnetic moment in the "−x" direction when the AP1 layer has a magnetic moment along the "−x" axis.

Figure 1B:
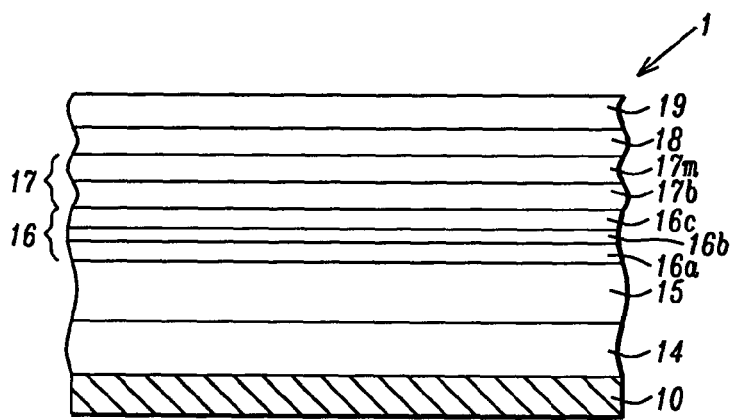
Figure 1C:
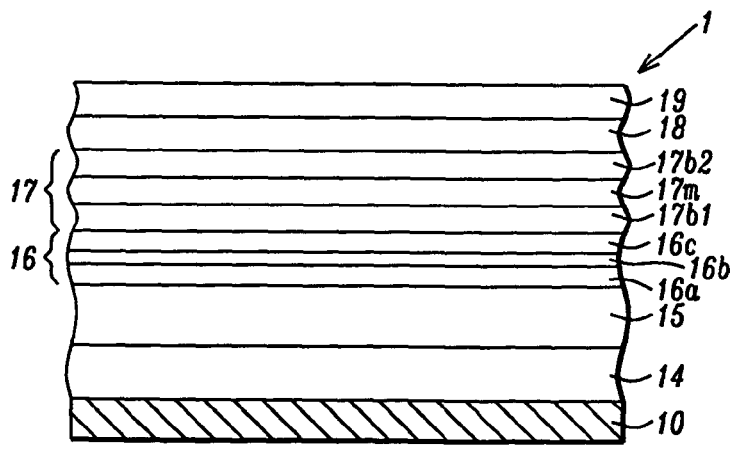
FIG. 1c and FIG. 1d are cross-sectional views showing a TMR stack of layers including a spacer comprised of three layers according to embodiments of the present invention.
Figure 1D:
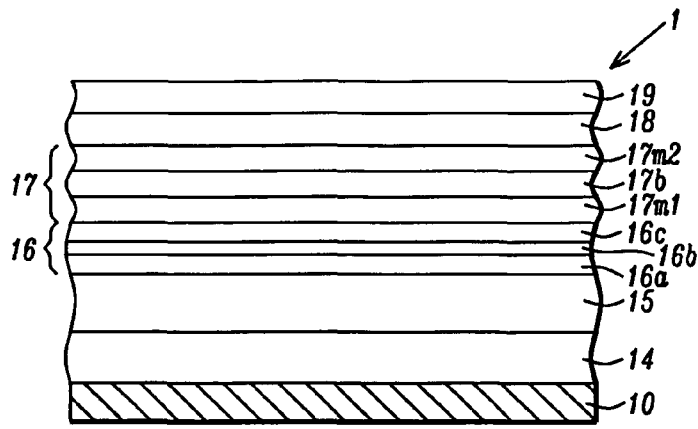
Figure 1E:
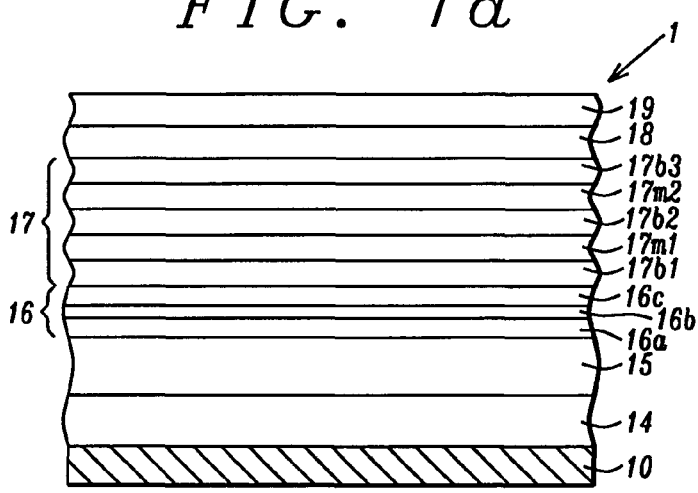
FIG. 1e and FIG. 1f are cross-sectional views showing a TMR stack of layers including a spacer comprised of more than three layers according to embodiments of the present invention.
Figure 1F:
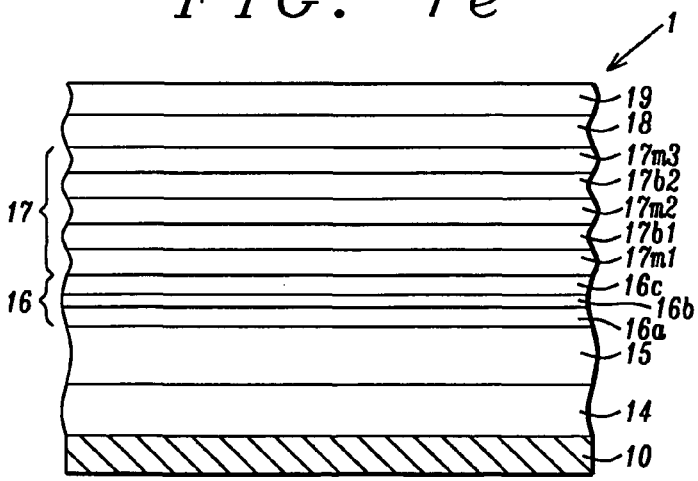

A key feature of the present invention is a composite spacer 17 that has at least one metal (M) layer such as Cu and one or more low band gap insulating or semiconductor materials (B) formed in an alternating fashion such as M/B (FIG. 1a), B/M, $(M/B)_n/M$, or $(B/M)_n/B$ where n is an integer. In a preferred embodiment, the spacer 17 may have a configuration represented by Cu/MgO/Cu, MgO/Cu/MgO, Cu/MgO, MgO/Cu, Cu/MgO/Cu/MgO/Cu, or a $(Cu/MgO)_n/Cu$ multilayer where each Cu layer has a thickness from 0.1 to 10 Angstroms and each MgO layer has a thickness between 5 and 20 Angstroms. Referring to FIG. 1b, an embodiment is depicted wherein the spacer 17 has a B/M configuration with a lower B layer 17b and an upper M layer 17m. In FIG. 1c, an embodiment is illustrated wherein spacer 17 has a (B/M/B) configuration with a lower B layer 17b1, a middle M layer 17m, and an upper B layer 17b2. Another embodiment is shown in FIG. 1d wherein spacer 17 has a (M/B/M) configuration with a lower M layer 17m1, a middle B layer 17b, and an upper M layer 17m2. A fifth embodiment is illustrated in FIG. 1e where spacer 17 has a (B/M/B/M/B) configuration with B layer 17b1, M layer 17m1, B layer 17b2, M layer 17m2, and upper B layer 17b3 sequentially formed on pinned layer 16. In FIG. 1f, a sixth embodiment is depicted wherein spacer 17 has a (M/B/M/B/M) configuration with M layer 17m1, B layer 17b1, M layer 17m2, B layer 17b2, and upper M layer 17m3 sequentially formed on pinned layer 16. Although the inventors are not bound by this theory, it is believed that the mechanism for achieving an ultra-low RA value of <0.4 micro ohm-cm$^2$ with the aforementioned spacer structure involves resonant tunneling.

The one or more MgO layers are preferably formed by depositing a first Mg layer having a thickness between 6 and 10 Angstroms on a Cu layer or pinned layer 16 and then oxidizing the Mg layer with a natural oxidation (NOX) or ROX process. In an alternative embodiment, a second Mg layer with a thickness of 0.5 to 7 Angstroms may be deposited on the oxidized first Mg layer. Under certain conditions, the MgO layer formed by the aforementioned process may be considered as having a MgO/Mg configuration depending on the thickness of the second Mg layer and the extent of oxygen diffusion from the MgO layer into the second Mg layer. The second Mg layer serves to protect the subsequently deposited free layer from oxidation. It is believed that excessive oxygen accumulates at the top surface of the MgO layer as a result of the NOX process and this oxygen can oxidize a free layer that is formed directly on the MgO portion of the spacer 17. Note that the RA and MR ratio for the TMR sensor may be adjusted by varying the thickness of the one or more MgO layers in spacer 17 and by varying the natural oxidation time and pressure. A thicker MgO layer resulting from longer oxidation time and/or higher pressure would increase the RA value. All layers in the TMR stack may be deposited in a DC sputtering chamber of a sputtering system such as an Anelva C-7100 sputter deposition system which includes ultra high vacuum DC magnetron sputter chambers with multiple targets and at least one oxidation chamber. Typically, the sputter deposition process involves an argon sputter gas and a base pressure between $5 \times 10^{-8}$ and $5 \times 10^{-9}$ torr. A lower pressure enables more uniform films to be deposited.

The NOX process may be performed in an oxidation chamber within the sputter deposition system by applying an oxygen pressure of 0.1 mTorr to 1 Torr for about 15 to 300 seconds. In the exemplary embodiment, no heating or cooling is applied to the oxidation chamber during the NOX process. Oxygen pressure between $10^{-6}$ and 1 Torr is preferred for an oxidation time mentioned above in order to achieve a RA value less than about 1 μohm-cm². A mixture of $O_2$ with other inert gases such as Ar, Kr, or Xe may also be used for better control of the oxidation process.

The present invention anticipates that the one or more MgO layers in spacer 17 could be formed by depositing a MgO layer on a Cu layer or pinned layer 16 with a rf-sputtering or reactive sputtering method. It should be understood that the performance of a TMR sensor fabricated with a barrier layer comprised of sputtered MgO will not be as desirable as one made according to the preferred embodiment of this invention. For example, the inventors have observed that the final RA uniformity (1σ) of 0.6 um circular devices is more than 10% when a MgO layer is rf-sputtered and less than 3% when a MgO layer is formed by DC sputtering a Mg layer followed by a NOX process.

In an alternative embodiment, the one or more MgO layers in spacer 17 may be replaced by other low band gap insulators including including ZnO, $Zn_xMg_{(1-x)}O$ where x is from 0 to 99 atomic %, ZnCuO, ZnCdO, ZnAlO, ZnSe, ZnTe, ZnS, SrTiO$_3$, SrOx, LaMnOx, Si, Ge, TiOx, AlN, GaN, InN, AlP, AlAs, AlSb, GaP, GaAs, GaSb, InP, InAs, CdS, CdTe, HgTe, PbS, PbSe, PbTe, SnTe, Cu$_2$O, FeSi$_2$, CrMnSi, Mg$_2$Si, RuSi$_3$, Ir$_3$Si$_5$ or semi-metals such as Sb, Bi, CoSi, FeSi, $Co_xFe_{(1-x)}$Si, $Co_xMn_{(1-x)}$Si, or $Co_xCr_{(1-x)}$Si. In yet another embodiment where there is a plurality of low band gap insulator layers in spacer 17, at least one of the low band gap insulator layers may have a different composition than the one or more other low band gap insulator layers.

In another embodiment, the one or more MgO layers in the spacer 17 may be doped with one or more of Zn, Mn, Al, Cu, Ni, Cd, Cr, Ti, Zr, Hf, Ru, Mo, Nb, Fe, Co and the like in an amount of up to about 50 atomic %. The present invention also encompasses an embodiment where there is a plurality of MgO layers in spacer 17 and at least one MgO layer is undoped and at least one MgO layer is doped with one or more of the aforementioned elements.

The present invention also encompasses an embodiment wherein the at least one Cu layer in spacer 17 may be replaced by other metals such as Au, Ag, Zn, Ru, or Al. In another aspect where there is a plurality of metal layers in spacer 17, at least one of the metal layers may be comprised of Cu and at least one of the metal layers may be comprised of Au, Ag, Zn, Ru, or Al.

The free layer 18 may have a bilayer configuration represented by CoFe/NiFe that provides a low magnetostriction and low coercivity (Hc). In an alternative embodiment, the free layer 18 may be a composite represented by a FeCo/CoB, CoFe/CoFeB, CoFe/CoFeB/NiFe, or other bilayer or trilayer structures used in the art.

Figure 2:
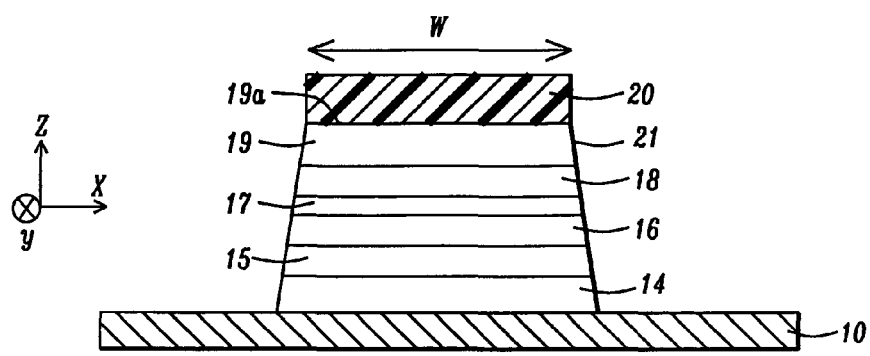
FIG. 2 is a cross-sectional view showing a TMR stack of layers that has been patterned to form a MTJ element during an intermediate step of fabricating the TMR sensor according to one embodiment of the present invention.

Above the free layer 18 is a capping layer 19 that may have a Ru/Ta/Ru configuration. Optionally, the capping layer 19 may be comprised of a composite such as Ru/Ta or other suitable capping layer materials used by those skilled in the art. Once the TMR stack is complete, the partially formed read head 1 may be annealed in a vacuum oven within the range of 240° C. to 340° C. with an applied magnetic field of at least 2000 Oe, and preferably 8000 Oe for about 2 to 10 hours to set the pinned layer and free layer magnetization directions. Note that under certain conditions, depending upon the time and temperature involved in the anneal process, the one or more MgO layers in the spacer 17 that have a MgO/Mg configuration may each form a homogeneous MgO layer as unreacted oxygen diffuses into the adjacent Mg layer. Referring to FIG. 2, the TMR stack is patterned by following a conventional process sequence. For example, a photoresist layer 20 may be coated on the capping layer 19. After the photoresist layer 20 is patterned, a reactive ion etch (RIE), ion beam etch (IBE), or the like is used to remove underlying layers in the TMR stack that are exposed by openings in the photoresist layer. The etch process stops on the bottom shield 10 or on a gap layer or barrier layer (not shown) to give a TMR sensor with a top surface 19a and sidewalls 21.

Figure 3:
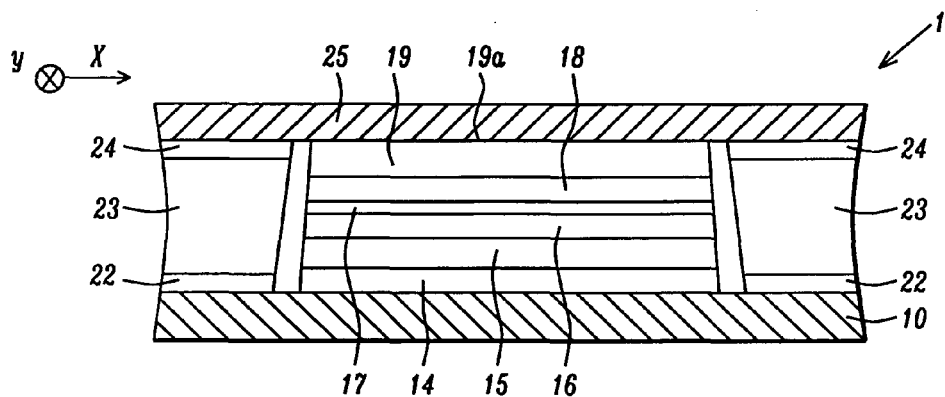
FIG. 3 is a cross-sectional view of a TMR read head having a MTJ element interposed between a top shield and bottom shield and formed according to an embodiment of the present invention.

Referring to FIG. 3, an insulating layer 22 may be deposited along the sidewalls 21 of the TMR sensor. The photoresist layer 20 is then removed by a lift off process. A top lead otherwise known as a top shield 25 is then deposited on the insulating layer 22 and top surface 19a of the TMR sensor. Similar to the bottom shield 10, the top shield 25 may also be a NiFe layer about 2 microns thick. The TMR read head 1 may be further comprised of a second gap layer (not shown) disposed between the capping layer 19 and the top shield 25.

EXAMPLE 1

A first experiment was conducted to demonstrate the improved performance achieved by implementing a composite spacer in a TMR sensor according to the present invention. A TMR stack of layers shown in Table 1 was fabricated and is comprised of a stack represented by seed/AFM/AP2/Ru/AP1/spacer/free layer/capping layer configuration. The seed layer has a 10 Angstrom thick lower Ta layer and an upper 20 Angstrom thick Ru layer. The AFM layer is a 70 Angstrom thick IrMn layer. The AP2/Ru/AP1 pinned layer structure has an AP2 layer with a FCC trilayer configuration that is $Fe_{10}Co_{90}/Fe_{70}Co_{30}/Fe_{10}Co_{90}$ where the lower layer is 12 Angstroms thick, the middle layer is 17 Angstroms thick, and the upper FeCo layer is 24 Angstroms thick. The Ru coupling layer has a 7.5 Angstrom thickness, and the AP1 layer is a $Fe_{70}Co_{30}/Cu/Fe_{70}Co_{30}$ laminate in which the FeCo layers have an 18 Angstrom thickness and the Cu layer is 2 Angstroms thick. The composite spacer is Cu/MgO according to one embodiment of the present invention. The 8 angstrom MgO layer was formed by RF deposition from a MgO target.

The inventor found that the results are similar when MgO is formed through a NOX process. The thicknesses in Angstroms of the other layers are given in parentheses: CoFe(10)/FeNi(35) free layer; and Ru(10)/Ta(60)/Ru(30) capping layer. The TMR stack was formed on a NiFe shield and was annealed under vacuum at 250° C. for 5 hours with an applied field of 8000 Oe. Surprisingly, the dR/R is rather large even with such a low RA value. In addition, the interlayer coupling field has been reduced to a relatively small value of about 23 Oe compared with an ultra-low RA sample the inventors have prepared by a prior art method. In other words, an ultra-low RA value of less than 1 ohm-cm$^2$ can only be achieved in prior art configurations by allowing Hin to increase to an unacceptable value of about 200 Oe or greater.

TABLE 1 dR/R and RA for low RA device with Cu/MgO spacer

| TMR stack | dR/R | RA µohm-cm$^2$ | Hin (Oe) |
|---|---|---|---|
| Ta10/Ru20/IrMn70/Fe$_{10}$Co$_{90}$12Fe$_{70}$Co$_{30}$17/ Fe$_{10}$Co$_{90}$24/Ru7.5/Fe$_{70}$Co$_{30}$18/Cu2/ Fe$_{70}$Co$_{30}$18/Cu3/MgO8/CoFe10/NiFe35/ Ru10/Ta60/Ru30 | 14.44 | 0.316 | 23.0 |

EXAMPLE 2

In a second example that represents an embodiment with a MgO/Cu/MgO composite spacer, a similar TMR stack was employed as shown in Table 1 except the Cu/MgO spacer was replaced with a MgO/Cu/MgO spacer in which the MgO layers are 6 Angstroms thick and the Cu layer is 3 Angstroms thick. The MgO layers were formed by a NOX process in an oxidation chamber of a sputter deposition system. Note that the dR/R remains surprisingly high even though MgO growth is perturbed by Cu insertion. Furthermore, Hin remains low considering the ultra-low RA value.

TABLE 2 dR/R and RA for low RA device with MgO/Cu/MgO spacer

| TMR stack | dR/R | RA µohm-cm$^2$ | Hin (Oe) |
|---|---|---|---|
| Ta10/Ru20/IrMn70/Fe$_{10}$Co$_{90}$12Fe$_{70}$Co$_{30}$17/ Fe$_{10}$Co$_{90}$24/Ru7.5/Fe$_{70}$Co$_{30}$18/Cu2/ Fe$_{70}$Co$_{30}$18/MgO6/Cu3/MgO6/CoFe10/NiFe35/ Ru10/Ta60/Ru30 | 12.90 | 0.340 | 27.0 |

EXAMPLE 3

In a third example that represents an embodiment with a MgO/Cu composite spacer, a similar TMR stack was employed as shown in Table 1 except the Cu/MgO spacer was replaced with a MgO/Cu spacer and the thicknesses of the Cu and MgO layers were kept at 3 Angstroms and 8 Angstroms, respectively. The MgO layer was formed by a NOX process in an oxidation chamber of a sputter deposition system. Again, the dR/R remains high and the Hin is low considering the ultra-low RA value.

TABLE 3 dR/R and RA for low RA device with MgO/Cu spacer

| TMR stack | dR/R | RA µohm-cm$^2$ | Hin (Oe) |
|---|---|---|---|
| Ta10/Ru20/IrMn70/Fe$_{10}$Co$_{90}$12Fe$_{70}$Co$_{30}$17/ Fe$_{10}$Co$_{90}$24/Ru7.5/Fe$_{70}$Co$_{30}$18/Cu2/ Fe$_{70}$Co$_{30}$18/MgO8/Cu3/CoFe10/NiFe35/ Ru10/Ta60/Ru30 | 13.47 | 0.380 | 18.0 |

EXAMPLE 4

In a fourth example that represents an embodiment with a Cu/MgO/Cu composite spacer, a similar TMR stack was employed as shown in Table 1 except the Cu/MgO spacer was replaced with a Cu/MgO/Cu spacer. The thickness of the MgO layer was kept at 8 Angstroms while the two Cu layers were each 2 Angstroms thick. The MgO layer was formed by a NOX process in an oxidation chamber of a sputter deposition system. Again, dR/R remains high and Hin is low considering the ultra-low RA value.

TABLE 4 dR/R and RA for low RA device with Cu/MgO/Cu spacer

| TMR stack | dR/R | RA µohm-cm$^2$ | Hin (Oe) |
|---|---|---|---|
| Ta10/Ru20/IrMn70/Fe$_{10}$Co$_{90}$12Fe$_{70}$Co$_{30}$17/ Fe$_{10}$Co$_{90}$24/Ru7.5/Fe$_{70}$Co$_{30}$18/ Cu2/Fe$_{70}$Co$_{30}$18/Cu2/MgO8/Cu2/CoFe10/ NiFe35/Ru10/Ta60/Ru30 | 12.90 | 0.363 | 15.0 |

The advantages of the present invention are that an ultra-low RA value of less than about 0.5 µohm-cm$^2$ can be achieved simultaneously with a high MR value of about 14% while maintaining a low magnetostriction and low Hin which is a significant overall improvement compared with prior art TMR sensors where an ultra-low RA value cannot be realized without unacceptable MR or a high Hin value of about 200 Oe or greater. The spacer layer disclosed herein may be fabricated without significant additional cost since no new sputtering targets or sputter chambers are required. Furthermore, a low temperature anneal process may be employed which is compatible with the processes for making GMR sensors. Therefore, there is no change in process flow and related processes compared with current manufacturing schemes.

While this invention has been particularly shown and described with reference to, the preferred embodiment thereof, it will be understood by those skilled in the art that various changes in form and details may be made without departing from the spirit and scope of this invention.

We claim:
1. An ultra-low RA (resistance x area) sensor, comprising:
(a) a stack of layers comprised of a seed layer, anti-ferromagnetic (AFM) layer, and a synthetic anti-ferromagnetic (SyAF) pinned layer having an AP2/coupling/AP1 configuration wherein the AP1 layer is comprised of a CoFe, CoFeB, CoB, FeB, or CoFeX layer wherein X=Ni, Cu, Mo, Cr, Zr, said AP1 layer contacts a composite spacer and said stack of layers is sequentially formed on a substrate;

(b) the composite spacer consists of one metal (M) layer and one low band gap insulating layer or semiconductor material layer (B) formed on the AP1 layer in a B/M, or M/B configuration;
(c) a free layer formed on the composite spacer; and
(d) a capping layer on the free layer.

2. The ultra-low RA sensor of claim 1 wherein the one metal layer is Cu and the one low band gap insulating layer is MgO to yield a composite spacer having a configuration represented by MgO/Cu, or Cu/MgO.

3. The ultra-low RA sensor of claim 2 wherein the one Cu layer has a thickness from about 0.1 to 10 Angstroms, and the MgO layer has a thickness between about 5 and 20 Angstroms.

4. The ultra-low RA sensor of claim 2 wherein the MgO layer is doped with at least one of Zn, Mn, Al, Cu, Ni, Cd, Cr, Ti, Zr, Hf, Ru, Mo, Nb, Co, or Fe in a concentration of about 50 atomic % or less.

5. The ultra-low RA sensor of claim 1 wherein the low band gap insulating layer is comprised of ZnO, $Zn_xMg_{(1-x)}O$ where x is from 0 to 99 atomic %, ZnCuO, ZnCdO, ZnAlO, ZnSe, ZnTe, ZnS, $SrTiO_3$, SrOx, LaMnOx, Si, Ge, TiOx, AlN, GaN, InN, AlP, AlAs, AlSb, GaP, GaAs, GaSb, InP, InAs, CdS, CdTe, HgTe, PbS, PbSe, PbTe, SnTe, $Cu_2O$, $FeSi_2$, CrMnSi, $Mg_2Si$, $RuSi_3$, or $Ir_3Si_5$.

6. The ultra-low RA sensor of claim 1 wherein the semiconductor material is comprised of Sb, Bi, CoSi, $Co_xFe_{(1-x)}Si$, $Co_xMn_{(1-x)}Si$, FeSi, or $Co_xCr_{(1-x)}Si$ wherein x is from 0 to about 99 atomic %.

7. The ultra-low RA sensor of claim 1 wherein the one metal layer is comprised of Cu, Au, Zn, Ru, or Al.

8. The ultra-low RA sensor of claim 1 wherein the AP2 layer has a trilayer FCC-like structure comprised of FeCo layers, the coupling layer is one of Ru, Rh, or Ir, and the AP1 layer has a laminated structure represented by $[CoFe/Cu]_m/CoFe$ wherein m=1, 2, or 3.

9. The ultra-low RA sensor of claim 1 wherein free layer is CoFe/NiFe, FeCo/CoB, CoFe/CoFeB, or CoFe/CoFeB/NiFe, and the capping layer is Ru/Ta/Ru or Ru/Ta.

10. A method of forming an ultra-low RA sensor, comprising:
(a) forming a stack of layers comprised of a seed layer, anti-ferromagnetic (AFM) layer, and a SyAF pinned layer having an AP2/coupling/AP1 configuration wherein the AP1 layer is comprised of a CoFe, CoFeB, CoB, FeB, or CoFeX layer wherein X=Ni, Cu, Mo, Cr, Zr, said AP1 layer contacts a composite spacer and said stack of layers is sequentially formed on a substrate;
(b) forming the composite spacer consisting of one metal (M) layer and one low band gap insulating layer or semiconductor material layer (B) formed on the AP1 layer in a B/M, or M/B configuration;
(c) forming a free layer formed on the composite spacer; and
(d) forming a capping layer on the free layer.

11. The method of claim 10 wherein the one metal layer is Cu and the low band gap insulating layer is MgO to yield a composite spacer having a configuration represented by MgO/Cu, or Cu/MgO.

12. The method of claim 11 wherein the Cu layer has a thickness from about 0.1 to 10 Angstroms, and the MgO layer has a thickness between about 5 and 20 Angstroms.

13. The method of claim 11 wherein the MgO layer is doped with at least one of Zn, Mn, Al, Cu, Ni, Cd, Cr, Ti, Zr, Hf, Ru, Mo, Nb, Co, or Fe in a concentration of about 50 atomic % or less.

14. The method of claim 11 wherein the MgO layer is formed by a process comprised of depositing a Mg layer on a Cu layer or AP1 layer, and performing a natural oxidation process or radical oxidation process to oxidize the Mg layer.

15. The method of claim 11 further comprised of annealing the ultra-low RA sensor before said stack of layers, composite spacer, free layer, and capping layer are patterned to form a sensor element.

16. The method of claim 10 wherein the metal layer is comprised of Cu, Au, Zn, Ru, or Al.

17. The method of claim 10 wherein the AP2 layer has a trilayer FCC-like structure comprised of FeCo layers, the coupling layer is one of Ru, Rh, or Ir, and the AP1 layer has a laminated structure represented by $[CoFe/Cu]_m/CoFe$ wherein m=1, 2, or 3.

18. The method of claim 10 wherein free layer is CoFe/NiFe, FeCo/CoB, CoFe/CoFeB, or CoFe/CoFeB/NiFe, and the capping layer is Ru/Ta/Ru or Ru/Ta.

19. The method of claim 10 wherein the low band gap insulating layers is comprised of ZnO, $Zn_xMg_{(1-x)}O$ where x is from 0 to 99 atomic %, ZnCuO, ZnCdO, ZnAlO, ZnSe, ZnTe, ZnS, $SrTiO_3$, SrOx, LaMnOx, Si, Ge, TiOx, AlN, GaN, InN, AlP, AlAs, AlSb, GaP, GaAs, GaSb, InP, InAs, CdS, CdTe, HgTe, PbS, PbSe, PbTe, SnTe, $Cu_2O$, $FeSi_2$, CrMnSi, $Mg_2Si$, $RuSi_3$, or $Ir_3Si_5$.

20. The method of claim 10 wherein the semiconductor material is comprised of Sb, Bi, CoSi, CoXFe(1-x)Si, CoXMn(1-x)Si, FeSi, or CoXCr(1-x)Si wherein x is from 0 to about 99 atomic %.

21. An ultra-low RA sensor, comprising:
(a) a stack of layers comprised of a seed layer, anti-ferromagnetic (AFM) layer, and a synthetic anti-ferromagnetic (SyAF) pinned layer having an AP2/coupling/AP1 configuration wherein the AP1 layer is comprised of a CoFe, CoFeB, CoB, FeB, or CoFeX layer wherein X=Ni, Cu, Mo, Cr, Zr, said AP1 layer contacts a composite spacer and said stack of layers is sequentially formed on a substrate;
(b) the composite spacer comprised of a plurality of metal (M) layers and one or more uniform and low band gap insulating layers or semiconductor material layers (B) formed in an alternating fashion on the AP1 layer to give a $(M/B)_n/M$ configuration where n is an integer and B is one of $Zn_xMg_{(1-x)}O$ where x is from 0 to 99 atomic %, ZnCuO, ZnCdO, ZnAlO, ZnSe, ZnTe, ZnS, $SrTiO_3$, SrOx, LaMnOx, Si, Ge, AlN, GaN, InN, AlP, AlAs, AlSb, GaP, GaAs, GaSb, InP, InAs, CdS, CdTe, HgTe, PbS, PbSe, PbTe, SnTe, $Cu_2O$, $FeSi_2$, CrMnSi, $Mg_2Si$, $RuSi_3$, $Ir_3Si_5$, Sb, Bi, CoSi, $Co_xFe_{(1-x)}Si$, $Co_xMn_{(1-x)}Si$, FeSi, or $Co_xCr_{(1-x)}Si$ where x is from 0 to about 99 atomic %, the one or more uniform B layers completely separate adjacent M layers such that there is a continuous interface between a top surface of a B layer with a first M layer and a continuous interface between a bottom surface of a B layer with a second M layer;
(c) a free layer formed on the composite spacer; and
(d) a capping layer on the free layer.

22. The ultra-low RA sensor of claim 21 wherein the plurality of metal layers is comprised of Cu, Au, Zn, Ru, or Al.

23. An ultra-low RA sensor, comprising:
(a) a stack of layers comprised of a seed layer, anti-ferromagnetic (AFM) layer, and a synthetic anti-ferromagnetic (SyAF) pinned layer having an AP2/coupling/AP1 configuration wherein the AP1 layer is comprised of a CoFe, CoFeB, CoB, FeB, or CoFeX layer wherein X=Ni, Cu, Mo, Cr, Zr, said AP1 layer contacts a composite spacer and said stack of layers is sequentially formed on a substrate;

(b) the composite spacer comprised of at least one metal (M) layer and a plurality of uniform and low band gap insulating layers or uniform semiconductor material layers (B) formed in an alternating fashion on the AP1 layer to give a $(B/M)_n/B$ configuration where n is an integer, the one or more M layers completely separate adjacent B layers such that there is a continuous interface between a top surface of a M layer with a first B layer and a continuous interface between a bottom surface of a M layer with a second B layer;

(c) a free layer formed on the composite spacer; and (d) a capping layer on the free layer.

24. The ultra-low RA sensor of claim 23 wherein the at least one metal layer is comprised of Cu, Au, Zn, Ru, or Al.

25. The ultra-low RA sensor of claim 23 wherein the uniform and low band gap insulating layers is comprised of ZnO, $Zn_xMg_{(1-x)}O$ where x is from 0 to 99 atomic %, ZnCuO, ZnCdO, ZnAlO, ZnSe, ZnTe, ZnS, $SrTiO_3$, SrOx, LaMnOx, Si, Ge, TiOx, AlN, GaN, InN, AlP, AlAs, AlSb, GaP, GaAs, GaSb, InP, InAs, CdS, CdTe, HgTe, PbS, PbSe, PbTe, SnTe, $Cu_2O$, $FeSi_2$, CrMnSi, $Mg_2Si$, $RuSi_3$, or $Ir_3Si_5$.

26. The ultra-low RA sensor of claim 23 wherein the uniform semiconductor layers are comprised of Sb, Bi, CoSi, $Co_xFe_{(1-x)}Si$, $Co_xMn_{(1-x)}Si$, FeSi, or $Co_xCr_{(1-x)}Si$ wherein x is from 0 to about 99 atomic %.

* * * * *